United States Patent

Wu

[11] Patent Number: 6,165,854
[45] Date of Patent: *Dec. 26, 2000

[54] METHOD TO FORM SHALLOW TRENCH ISOLATION WITH AN OXYNITRIDE BUFFER LAYER

[75] Inventor: Shye-Lin Wu, Hsinchu, Taiwan

[73] Assignee: Texas Instruments-Acer Incorporated, Hsinchu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 09/072,290

[22] Filed: May 4, 1998

[51] Int. Cl.[7] ........................... H01L 21/336; H01L 21/76
[52] U.S. Cl. ........................ 438/296; 438/404; 438/424; 438/430
[58] Field of Search ................................ 438/296, 404, 438/424, 430

[56] References Cited

U.S. PATENT DOCUMENTS

| | | |
|---|---|---|
| 5,433,794 | 7/1995 | Fazan et al. |
| 5,521,422 | 5/1996 | Mandelman et al. |
| 5,741,740 | 4/1998 | Jang et al. |
| 5,763,315 | 6/1998 | Benedict et al. |
| 5,897,361 | 4/1999 | Egawa |
| 5,989,977 | 11/1999 | Wu |
| 6,020,230 | 2/2000 | Wu |

OTHER PUBLICATIONS

Wolf, S.and Tauber, R.N., Silicon Processing for the VLSI Era, vol. 1, Lattice Press pp. 532–534, 546,1986.

A.E.T. Kuiper et al., Oxidation Behaviour of LPCVD Silicon Oxynitride Films, Applied Surface Science 33/34 (1988), pp. 757–764.

Andres Bryant et al.,Characteristics of CMOS Device Isolation for the ULSI Age, 1994 IEEE, pp. 671–674.

O.Joubert et al., Polysilicon Gate Etching in High–Density Plasmas: Comparison Between Oxide Hard Mask and Resist Mask, J. Electrochem. Socx., vol. 144, No. 5, May 1997, pp. 1854–1861.

*Primary Examiner*—John F. Niebling
*Assistant Examiner*—Josetta Jones
*Attorney, Agent, or Firm*—Harness, Dickey & Pierce, P.L.C.

[57] ABSTRACT

The present invention proposes a method for fabricating shallow trench regions for isolation. An oxide hard mask is utilized for the silicon etching. A silicon oxynitride film is created near the trench corners to prevent the gate wrap-around and corner parasitic leakage. Forming trench regions on a semiconductor substrate by using a thick pad oxide layer as an etching hard mask. A thermal oxide film is grown to recover the etching damages. An undoped LPCVD amorphous silicon film is then deposited on entire surface of the semiconductor substrate. A high temperature/pressure oxidation process follows to convert the undoped amorphous silicon film into thermal oxide. A thick CVD oxide layer is deposited on the semiconductor substrate. The oxide film outside the trench regions is removed by using a CMP process. Finally, the MOS devices are fabricated on the semiconductor substrate by standard processes, and thus complete the present invention.

20 Claims, 3 Drawing Sheets

METHOD TO FORM SHALLOW TRENCH ISOLATION WITH AN OXYNITRIDE BUFFER LAYER

BACKGROUND OF THE INVENTION

1. Field of the Invention

The present invention relates to a semiconductor device, and more especially, to a method for fabricating shallow trench isolation.

2. Description of the Prior Art

In the integrated circuit industry today, hundreds of thousands of semiconductor devices are built on a single chip. Every device on the chip must be electrically isolated to ensure that they operate independently without interfering with each other. The art of isolating semiconductor devices has become one important aspect of modern metal-oxide-semiconductor (MOS) and bipolar integrated circuit technology for the separation of different devices or different functional regions. With the high integration of the semiconductor devices, improper isolation among devices will cause current leakage, and the current leakage can consume a significant amount of power. Improper isolation also can exacerbate latch-up, which can damage the circuit temporarily or permanently. In addition, improper isolation can result in noise margin degradation, voltage shift and crosstalk.

Local oxidation of silicon (LOCOS) is one of the most well-known techniques for isolation. LOCOS provides the isolation by oxidizing the silicon substrate to create silicon dioxide regions among active devices or functional regions. Because it is easy for the silicon substrate to be oxidized into silicon dioxide, LOCOS has the benefits of its process simplicity and low cost, and has become the most widely used isolation technique in very large scale integrated (VLSI) circuit. However, with the tendency for the manufacture of semiconductor integral circuit to achieve high package density, LOCOS meets the limitation in its scalability.

The trench isolation, or, named the shallow trench isolation (STI), is another isolation technique developed especially for a semiconductor chip with high integration. The trench regions are formed in the semiconductor substrate by recessing the substrate deep enough for isolation and refilling with insulating material to provide the isolation among active devices or different well regions. In general, trench isolation has a better scalability in comparison with LOCOS isolation.

In the paper "Characteristics of CMOS Device Isolation for the ULSI Age" appearing in IEDM Tech. Dig., p. 671, 1994, by A. Bryant, et al., the two different isolation techniques of LOCOS and STI are investigated. The writers review how LOCOS and STI isolations are being improved to meet the scaling requirements for abrupt active-isolation transitions, isolation depth, and isolation planarity. For deep sub-micron CMOS generation, the conventional LOCOS isolation suffers from several drawbacks such as large lateral extend of bird's beak, non-planarity, local field oxide thinning effect, and stressinduced silicon defects. The key challenges to LOCOS scaling are insulator thinning at narrow dimension, bird's beak formation, and field-implant encroachment. For future CMOS technology, an effective device isolation method that provides abrupt transitions to active device regions with minimum impact on device characteristics or topography will be required. They come to the conclusions that, at the cost of a trench-fill and planarization, STI is a more direct method of meeting these requirements while benefiting from a significant advantage in planarity.

Trench isolation develops to be a better isolation technique in deep submicron CMOS generation due to the advantages in its scalability, planarity, and isolation depth. But it still encounters several problems, such as silicon damage induced by etching, and the corner effects. As mentioned by J. A. Mandelman, et al., in U.S. Pat. No. 5,521,422 entitled "CORNER PROTECTED SHALLOW TRENCH ISOLATION DEVICE", the parasitic leakage path results from an enhancement of the gate electric field near the trench corner. Even worse, the gate conductor could wrap around the trench corner. They propose for above situation a trench isolation structure with a sidewall around. With this sidewall trench structure, the corner parasitic leakage and the gate wrap-around could be solved.

P. C. Fazan, et al., propose another method for eliminating the corner effects in U.S. Pat. No. 5,433,794 entitled "SPACERS USED TO FORM ISOLATION TRENCHES WITH IMPROVED CORNERS". They create a smooth trench profile with a self-aligned cap or dome. The isolating material is deposited extending over the peripheral edge of the trench, thereby covering at least a portion of the substrate surrounding the trench, and substantially limiting leakage of the active devices disposed on the substrate.

SUMMARY OF THE INVENTION

A method for fabricating shallow trench regions on a semiconductor substrate is disclosed. An oxide hard mask is utilized for the silicon etching to form the trenches. A silicon oxynitride film is created near the trench corners to prevent the corner effects such as the gate wrap-around and corner parasitic leakage.

Forming a thick pad oxide layer on a semiconductor substrate, the trench region and active area are defined by a photoresist photolithography followed by an anisotropic pad oxide etching. The semiconductor substrate is recessed to form trenches by another dry etching using the pad oxide layer as a mask. After removing the pad oxide layer, a thermal oxide film is regrown on the surface of the substrate and trench regions to recover the etching damages. An LPCVD silicon oxynitride film is then deposited on entire surface of the semiconductor substrate. A thick CVD oxide layer, which is formed of TEOS-oxide or BPSG, etc., is following deposited on the LPCVD silicon oxynitride film. A high temperature annealing process follows to densify the thick CVD oxide layer. The portions outside the trench regions of the oxide film and LPCVD silicon oxynitride film are removed by using a CMP process. A sacrificial oxide film is then regrown and etched back. Finally, the MOS devices are fabricated on the semiconductor substrate by standard processes, and thus complete the present invention.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention proposes a method to fabricate shallow trenches for isolation. The method described here includes many standard processes well-known in the art like photolithography, etching or chemical vapor deposition (CVD) which are not discussed in detail. In addition, the present invention utilizes an oxide hard mask instead of resist mask for the silicon etching to form the trenches. And, a silicon oxynitride film is created to prevent the corner effect such as the gate wrap-around and corner parasitic leakage.

Figure 1:
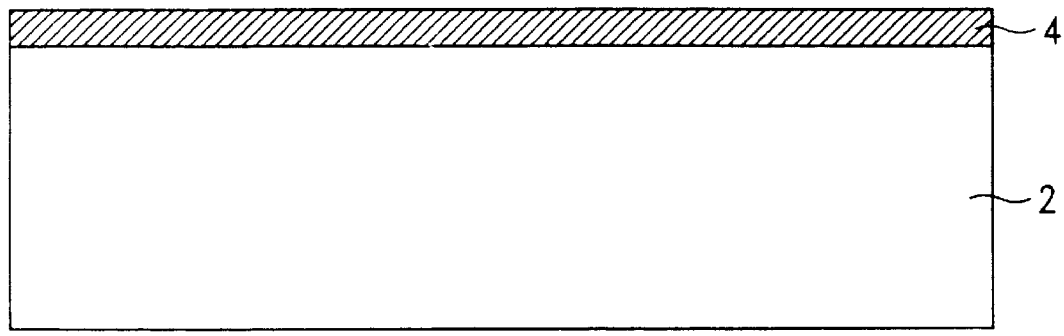
FIG. 1 is a cross-sectional view of a semiconductor wafer illustrating the step of forming a pad oxide layer on the substrate according to the present invention.

Referring to FIG. 1, a single crystal silicon substrate 2 with a <100> crystallographic orientation is provided. A thick silicon oxide layer 4 is formed on the surface of the substrate 2. This silicon oxide layer 4 has a thickness of about 300–2000 angstroms, and serves as an etching hard mask later. A thermal oxidation in a dry or wet oxygen containing ambient at a temperature of about 800–1100° C. will be a suitable method to grow this silicon oxide layer 4 on the semiconductor substrate. Alternatively, this silicon oxide layer 4 can be deposited by using low pressure chemical vapor deposition (LPCVD) at a temperature in the range of about 400–750° C.

Figure 2:
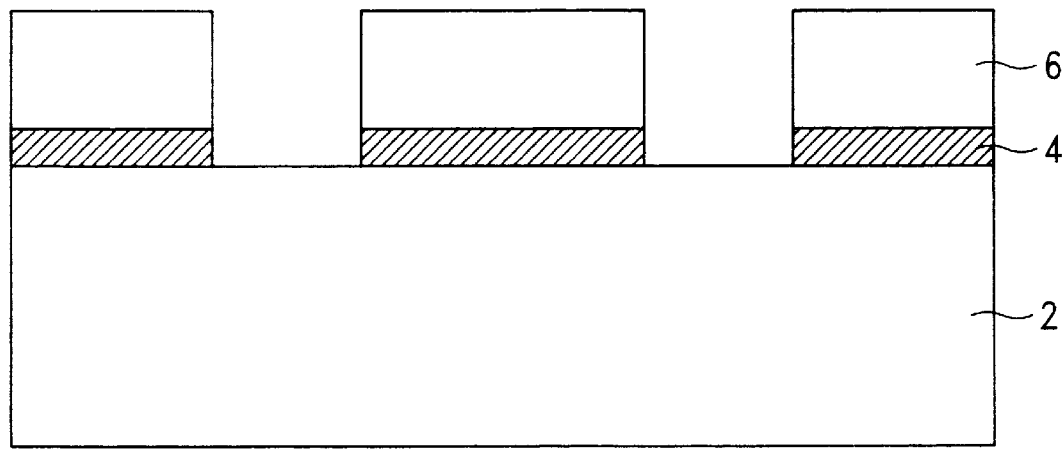
FIG. 2 is a cross-sectional view of a semiconductor wafer illustrating the step of defining the trench regions on the substrate by patterning a photoresist and etching the pad oxide layer according to the present invention.

Turning next to FIG. 2, the photoresist 6 is now formed on the silicon oxide layer 4 with the trench pattern. This trench pattern is defined by using a conventional manner of photolithography including photoresist coating, exposure, and development processes. A dry etching process such as reactive ion etching (RIE) is then performed to etch the thick silicon oxide layer 4 and expose the trench regions of the semiconductor substrate 2. Plasma gases containing fluoride such as $CF_4$, $CHF_3$, $C_2F_6$ or $C_3F_8$ is preferable for this anisotropic etching.

Figure 3:
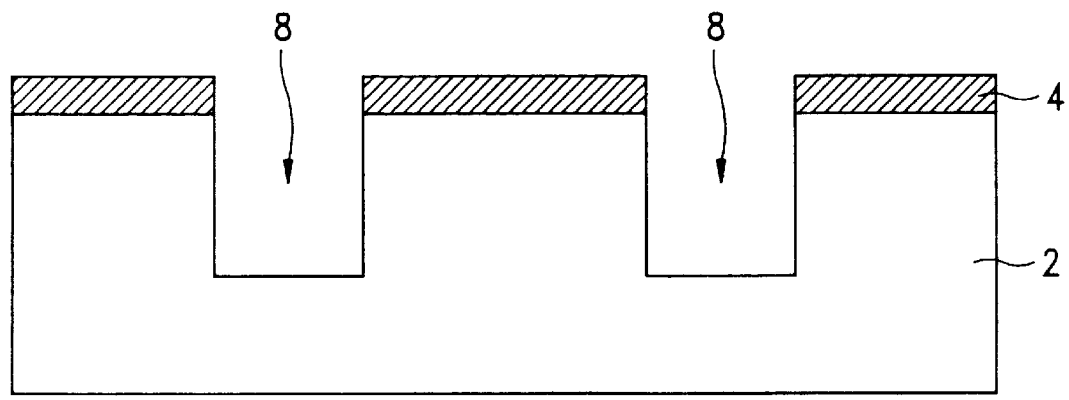
FIG. 3 is a cross-sectional view of a semiconductor wafer illustrating the step of recessing the silicon substrate to form shallow trenches according to the present invention.

Turning next to FIG. 3, after the photoresist 6 is removed and wet cleaned, another dry etching using $Cl_2$, $BCl_3$, HBr, $SF_6$ or $SiCl_4$ as the plasma source is carried out. At this anisotropic etching step, the exposed portion of the semiconductor substrate 2 is recessed to form the trenches 8 with a depth deep enough for isolation. As suggested by O. Joubert and F. H. Bell in their paper "Polysilicon Gate Etching in High-Density Plasma: Comparison Between Oxide Hard Mask and Resist Mask" in J. Electrochem. Soc., Vol. 144, p. 1854 at 1997, the patterned thick pad oxide layer 4 is used here as an etching hard mask instead of a resist mask. By the use of the oxide mask, the carbon contamination can be reduced, and the silicon etching process can be developed without creating structure defects.

Figure 4:
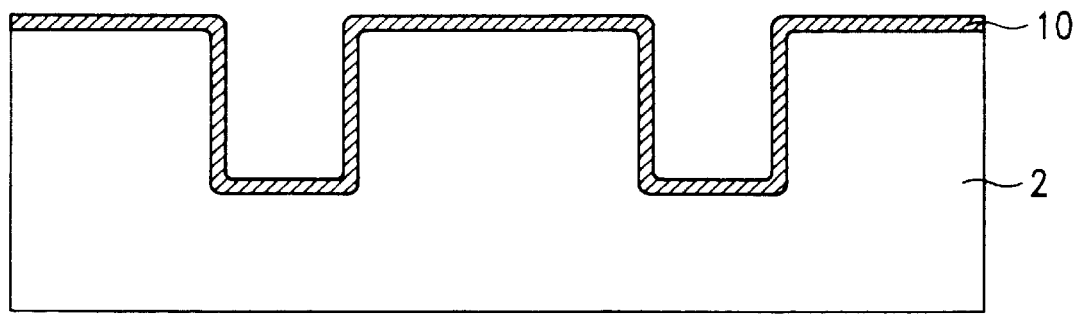
FIG. 4 is a cross-sectional view of a semiconductor wafer illustrating the step of removing the pad oxide layer and growing a thermal oxide on the substrate according to the present invention.
Figure 5:
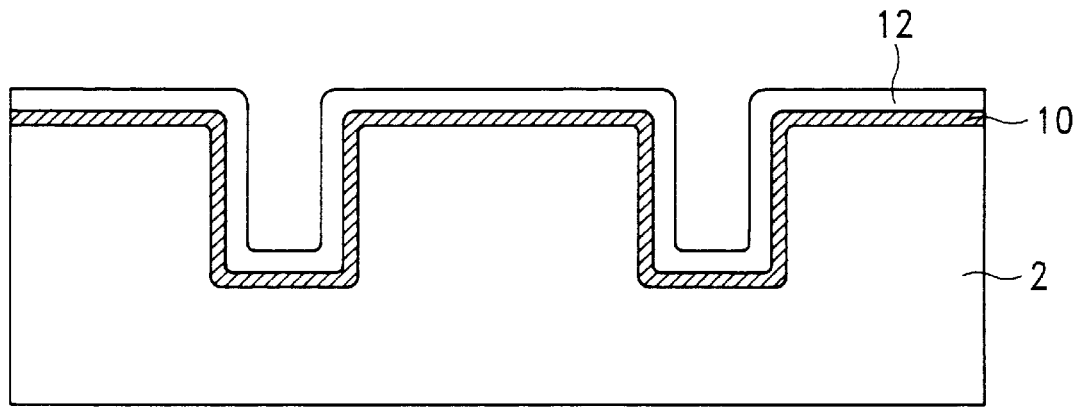
FIG. 5 is a cross-sectional view of a semiconductor wafer illustrating the step of depositing a silicon oxynitride layer on the substrate according to the present invention.

Referring to FIG. 4, the thick pad oxide layer 4 is removed by using buffered oxide-etching (BOE) solution or diluted solution of hydrofluoric acid (HF) as the etchant. A thermal oxide film 10 is regrown over the semiconductor substrate 2 by a thermal process in an oxygen containing ambient at a temperature of about 800–1100° C. . The damages induced on the substrate surface by previous dry etching process are recovered through this thermal process and the trench corners are rounded simultaneously. Thereafter, a silicon oxynitride film 12 is deposited conformally on all area of the semiconductor substrate 2 as shown in FIG. 5. This silicon oxynitride film 12 is preferably formed by a low pressure chemical vapor deposition (LPCVD) or a plasma enhanced chemical vapor deposition (PECVD) at a temperature of about 400–900° C. with a thickness of about 100 to 500 angstroms. The behavior of this silicon oxynitride film formed by LPCVD can refer to the paper entitled "OXIDATION BEHAVIOUR OF LPCVD SILICON OXYNITRIDE FILMS" in Applied Surface Science, Vol. 33/34, p. 757, 1988, by A. E. T. Kuiper.

Figure 6:
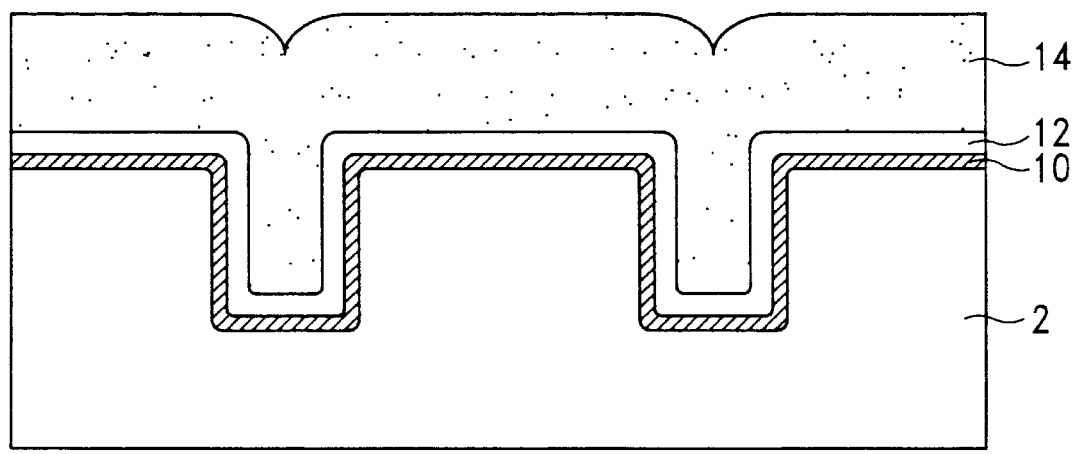
FIG. 6 is a cross-sectional view of a semiconductor wafer illustrating the step of depositing a CVD oxide layer on the substrate and refilling the trenches according to the present invention.

A thick CVD oxide layer 14 is now deposited over the semiconductor substrate 2 and fills the trench regions as shown in FIG. 6. The suitable method for forming this thick CVD oxide layer 14 can be LPCVD, PECVD (plasma-enhanced CVD) or HDPCVD (high-density plasma CVD) with the material of tetra-ethyl-ortho-silicate-oxide (TEOS-oxide), boro-phospho silicate glass (BPSG), phospho silicate glass (PSG), boro silicate glass, (BSG), or undoped silicate glass (USG), and so on. A high temperature annealing process performed in oxygen environment follows to densify the CVD oxide layer 14 for a better dielectric property and a higher density to prevent from recessing too much at later wet etching process. The temperature employed for this annealing process is about 800 to 1100° C.

Figure 7:
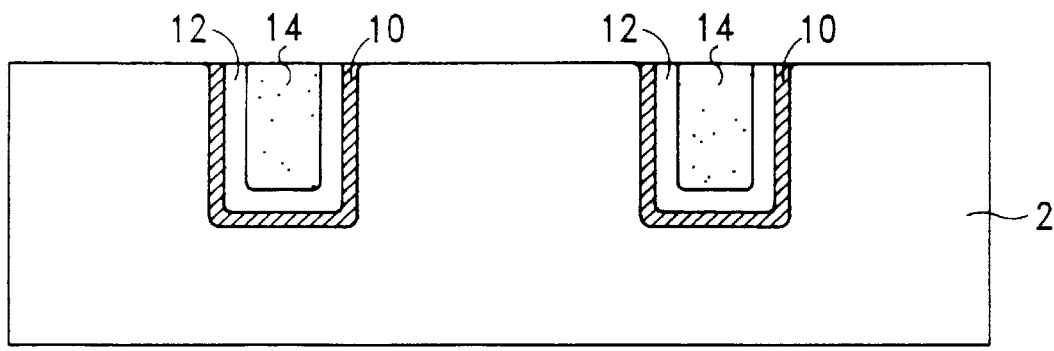
FIG. 7 is a cross-sectional view of a semiconductor wafer illustrating the step of removing the CVD oxide layer, the oxynitride layer and the thermal oxide layer outside the trench regions on the substrate according to the present invention.
Figure 8:
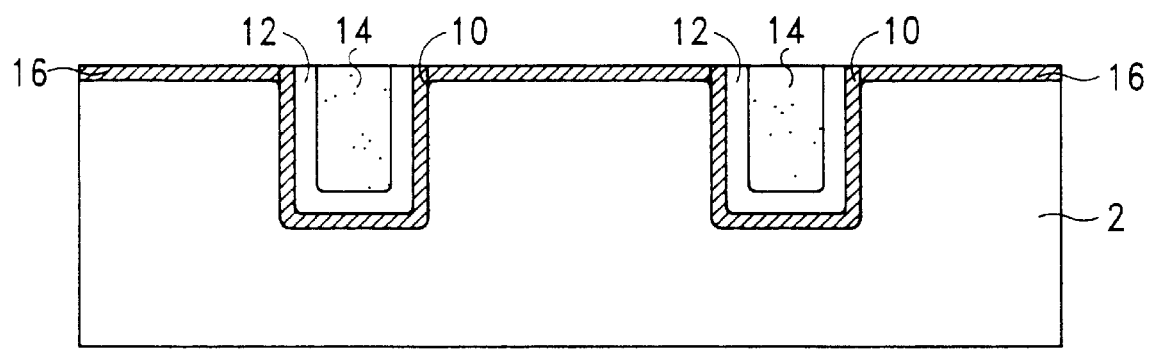
FIG. 8 is a cross-sectional view of a semiconductor wafer illustrating the step of regrowing a sacrificial oxide according to the present invention.

Now referring to FIG. 7, portions of the CVD oxide layer 14, the silicon oxynitride layer 12, and the thermal oxide layer 10, which exceed the trenches regions in the semiconductor substrate 2, are stripped. The preferable method for this step can be chemical mechanical polishing (CMP) process, and the global planarization can be achieved simultaneously. As to be the end point of the CMP process, the surface of the semiconductor substrate 2 will suffer from the polishing defects and contamination after this step. For recovering the polishing defects and eliminating the contamination, a thermal oxidation is performed and a sacrificial oxide layer 16 is regrown on the semiconductor substrate 2 as shown in FIG. 8.

Figure 9:
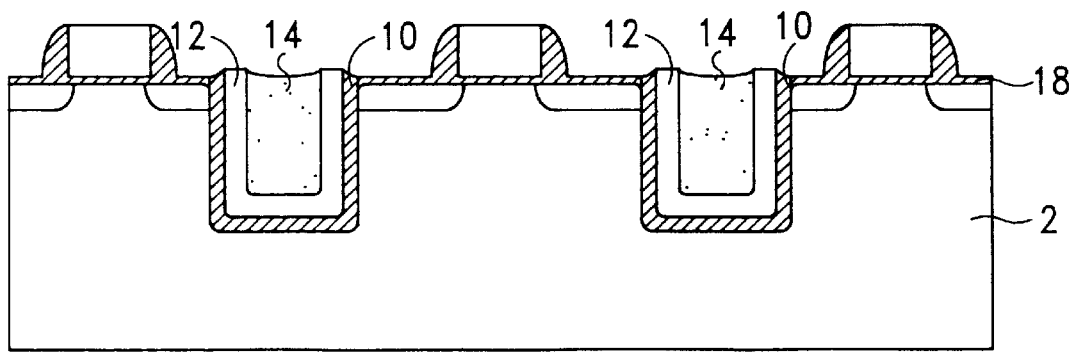
FIG. 9 is a cross-sectional view of a semiconductor wafer illustrating the step of fabricating MOSFET on the substrate according to the present invention.

Next, referring to FIG. 9, the sacrificial oxide layer 16 is then etched back by a wet etching process. The preferable etchant for this wet etching is buffered oxide-etching (BOE) solution or diluted solution of hydrofluoric acid (HF). Because of the higher etching resistance than sacrificial oxide layer 16, CVD oxide layer 14 and thermal oxide layer 10 for wet oxide etching process, the silicon oxynitride layer 12 has a lower etching rate than the others, and will consequently protrude at the edges of the trench surface. Thus, the corner effects such as the gate wrap-around and the corner parasitic leakage can be improved. The trenching isolation regions with planarized surface are then accomplished.

Finally, the gate oxide layer 18 is regrown and the active devices that consist of gates, sources and drains are formed on the active regions to finish the fabrication of the CMOS transistor.

According to above processes, the trench regions, which consist of the thermal oxide layer 10, the silicon oxynitride 12 and the CVD oxide 14, are formed in a semiconductor substrate 2 to provide isolation among active devices. The silicon damage induced by dry etching process would be reduced through long high temperature oxidation anneal. The gate wrap-around of the trench corners is minimized because of the protruded silicon oxynitride film at the trench edges. The trench regions thus have rounded top and bottom corners without suffering from corner effects such as corner parasitic leakage. By solving these problems raised from conventional trench isolation technique, the integration of semiconductor fabrication can be greatly increased, and the method of the present invention can be applied in deep sub-micron or smaller CMOS devices.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for forming a trench isolation region in a semiconductor substrate, said method comprising:

opening a trench region in said semiconductor substrate;

forming a first dielectric liner on the surface of said semiconductor substrate and the sidewalls and bottom surface of said trench regions;

forming a second dielectric liner on said first dielectric liner;

depositing a trench-filling layer on said second dielectric liner, thereby filling said trench region;

removing portions of said trench-filling layer, said second dielectric liner and said first dielectric liner which exceed said trench regions;

performing a substrate-surface oxidation to form a sacrificial oxide layer on the surface of said semiconductor substrate; and removing said sacrificial oxide layer using an etching process with higher etching selectivity to said sacrificial oxide layer over said second dielectric liner, thereby said second dielectric liner protruding over the surface of said semiconductor substrate.

2. The method according to claim 1, further comprising the following steps to open said trench regions:

forming a pad oxide layer on said semiconductor substrate;

patterning a photoresist on said pad oxide layer to define trench regions of said semiconductor substrate;

etching said pad oxide layer to expose a portion of said semiconductor substrate which defines said trench regions of said semiconductor substrate, said etching uses said patterned photoresist as an etching mask;

etching said semiconductor substrate using said patterned pad oxide layer as an etching mask to form trench regions in said semiconductor substrate; and removing said patterned pad oxide layer.

3. The method according to claim 2, wherein said pad oxide layer has a thickness of about 300 to 2000 angstroms.

4. The method according to claim 2, wherein said pad oxide layer is patterned by an anisotropic etching using a plasma source selected from the group consisting of $CF_4$, $CHF_3$, $C_2F_6$ and $C_3F_8$.

5. The method according to claim 2, wherein said trenches are recessed by an anisotropic etching using a plasma source selected from the group consisting of $Cl_2$, $BCl_3$, HBr, $SF_6$ and $SiCl_4$.

6. The method according to claim 2, wherein said pad oxide layer is removed by using a etchant selected from the group consisting of buffered oxide-etching (BOE) solution and diluted solution of hydrofluoric acid (HF).

7. The method according to claim 1, wherein said first dielectric liner is formed of silicon oxide.

8. The method according to claim 7, wherein said first dielectric liner is formed by a trench-surface oxidation.

9. The method according to claim 8, wherein said trench-surface oxidation is performed at a temperature of about 800 to 1100° C.

10. The method according to claim 1, wherein said second dielectric liner is formed of silicon oxynitride.

11. The method according to claim 1, wherein said trench-filling layer is a silicon oxide layer formed of a material selected from the group consisting of tetra-ethyl-ortho-silicate-oxide (TEOS-oxide), boro-phospho silicate glass (BPSG), phospho silicate glass (PSG), boro silicate glass, (BSG), and undoped silicate glass (USG).

12. The method according to claim 1, further comprising an annealing step after said trench-filling layer is deposited, thereby densifying said trench-filling layer, said annealing is performed in an oxygen containing ambient at a temperature of about 800 to 1100° C.

13. The method according to claim 1, wherein said exceeding portions of said trench-filling layer, said second dielectric liner and said first dielectric liner are removed by a chemical mechanical polishing (CMP) process.

14. The method according to claim 1, wherein said sacrificial oxide layer is removed by a wet etching using a etchant selected from the group consisting of buffered oxide-etching (BOE) solution and diluted solution of hydrofluoric acid (HF).

15. A method for forming trench isolation regions in a semiconductor substrate, said method comprising:

opening trench regions in said semiconductor substrate;

performing a first oxidation to form a first oxide liner on the surface of said semiconductor substrate and the sidewalls and bottom surface of said trench regions;

forming a silicon oxynitride liner on said first oxide liner;

depositing a second oxide layer on said silicon oxynitride liner, thereby filling said trench regions;

removing portions of said second oxide layer, said silicon oxynitride liner and said first oxide liner which exceed said trench regions;

performing a second oxidation to form a sacrificial oxide layer on the surface of said semiconductor substrate; and removing said sacrificial oxide layer using etching process with higher etching selectivity to silicon oxide over silicon oxynitride, thereby said silicon oxynitride liner protruding over the surface of said semiconductor substrate.

16. The method according to claim 1, further comprising the following steps to open said trench regions:

patterning a photoresist on said pad oxide layer to define trench regions of said semiconductor substrate;

etching said pad oxide layer to expose a portion of said semiconductor substrate which defines said trench regions of said semiconductor substrate, said etching uses said patterned photoresist as an etching mask;

etching said semiconductor substrate using said patterned pad oxide layer as an etching mask to form trench regions in said semiconductor substrate; and removing said patterned pad oxide layer.

17. The method according to claim 1, wherein said second oxide layer is formed of a material selected from the group consisting of tetra-ethylortho-silicate-oxide (TEOS-oxide), boro-phospho silicate glass (BPSG), phospho silicate glass (PSG), boro silicate glass, (BSG), and undoped silicate glass (USG).

18. The method according to claim 15, further comprising an annealing step after said second oxide layer is deposited, thereby densifying said second oxide layer, said annealing is performed in an oxygen containing ambient at a temperature of about 800 to 1100° C.

19. The method according to claim 15, wherein said exceeding portions of said second oxide layer, said second dielectric liner and said first oxide liners are removed by a chemical mechanical polishing (CMP) process.

20. The method according to claim 15, wherein said sacrificial oxide layer is removed by a wet etching using a etchant selected from the group consisting of buffered oxide-etching (BOE) solution and diluted solution of hydrofluoric acid (HF).

* * * * *